United States Patent [19]

Hartmann

[11] 4,353,046
[45] Oct. 5, 1982

[54] SURFACE ACOUSTIC WAVE DEVICE WITH REFLECTORS

[75] Inventor: Clinton S. Hartmann, Dallas, Tex.

[73] Assignee: R F Monolithics, Inc., Dallas, Tex.

[21] Appl. No.: 204,064

[22] Filed: Nov. 4, 1980

[51] Int. Cl.$^3$ .................. H03H 9/25; H03H 9/64; H03H 9/145

[52] U.S. Cl. .................. 333/194; 310/313 D; 333/195; 333/196

[58] Field of Search .................. 333/150–155, 333/193–196; 310/313 R, 313 A, 313 B, 313 C, 313 D, 365–366; 331/107 A

[56] References Cited

U.S. PATENT DOCUMENTS

| | | | |
|---|---|---|---|
| 3,360,749 | 12/1967 | Sittig | 333/152 |
| 3,686,518 | 8/1972 | Hartmann et al. | 333/154 X |
| 3,727,155 | 4/1973 | DeVries | 333/194 |
| 3,886,504 | 5/1975 | Hartmann et al. | 333/195 |
| 4,114,119 | 9/1978 | Sandy et al. | 333/195 |
| 4,144,507 | 3/1979 | Shreve | 333/153 X |

OTHER PUBLICATIONS

Hartmann et al.–"Impulse Model Design of Acoustic Surface-Wave Filters," IEEE Trans. on Microwave Theory and Techniques, vol. MTT-21, No. 4, Apr. 1973 pp. 162–175.
Staples et al.–"UHF Surface Acoustic Resonators," 1974 Ultrasonics Symposium Proceedings, IEEE Cat. #74 CHO 896-ISU; pp. 245–252.
Jones et al.–"Second Order Effects in Surface Wave Devices" IEEE Trans. on Sonics and Ultrasonics, vol. SU-19, No. 3, Jul. 1972; pp. 368–377.
Smith et al.–"Fundamental and Harmonic-Frequency Circuit-Model Analysis of Interdigital Transducers with Arbitrary Metallization Ratios and Polarity Sequences," IEEE Trans. on Microwave Theory and Techniques, vol. MTT-23, No. 11, Nov. 1975; 853–864.
Cross–"Surface Acoustic Wave Resonator Filters Using Tapered Gratings," IEEE Trans. on Sonics and Ultrasonics, vol. SU-25, No. 5, Sep. 1978; pp. 313–319.
Hartmann–"Weighting Interdigital Surface Wave Transducers by Selective Withdrawal of Electrodes", 1973 Ultrasonic Symposium Proceedings, IEEE Cat. #73 CHO-8SE; pp. 423–426.
Smith–"Key Tradeoffs in Saw Transducer Design and Component Specification," Ultrasonic Symposium Proceedings (1976), IEEE Cat. #CH1120-5SU; pp. 547–552.
Haydl–"Multimode Saw Resonators–a Method to Study the Optimum Resonator Design," 1976 Ultrasonic Symposium Proceedings, IEEE Cat. #76 CH1120-5SU; pp. 287–296.
Autran et al.–"Application of CAD Techniques to Saw Filters," Electronic Engineering, May 1977; pp. 51–54.

*Primary Examiner*—Marvin L. Nussbaum
*Attorney, Agent, or Firm*—Kanz & Timmons

[57] ABSTRACT

A surface wave device is disclosed which includes a substrate (12) having a piezoelectric surface (14), an acoustic surface wave transducer (16 and 18) for converting between an electrical signal and acoustic surface waves propagating on the piezoelectric surface and reflective structures (22) which cause reflections of acoustic surface waves in the portion of the piezoelectric surface over which the transducer is disposed. Numerous kinds of reflective structures are disclosed. An acoustic surface wave resonator using the present invention is disclosed, along with bandpass filters with multiple poles. A low-loss transversal filter using the present invention is also disclosed.

19 Claims, 25 Drawing Figures

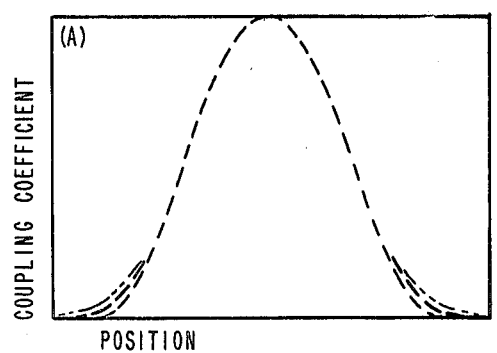
FIG. 10
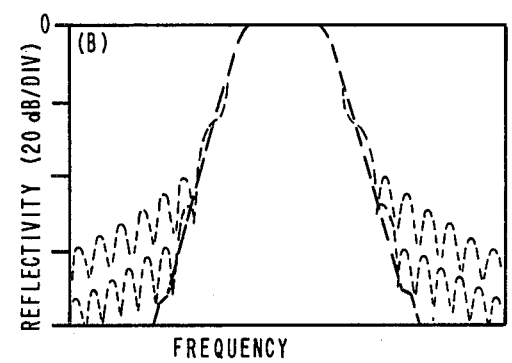
FIG. 11
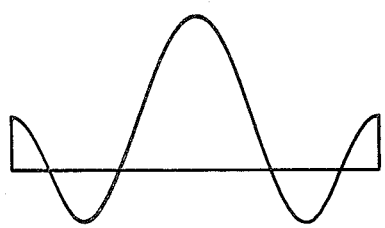
FIG. 12
TRANSDUCER
WEIGHTING FUNCTION
FIG. 13
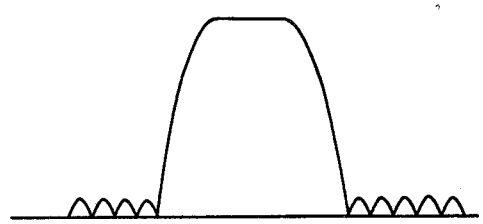
TRANSDUCER
FREQUENCY RESPONSE

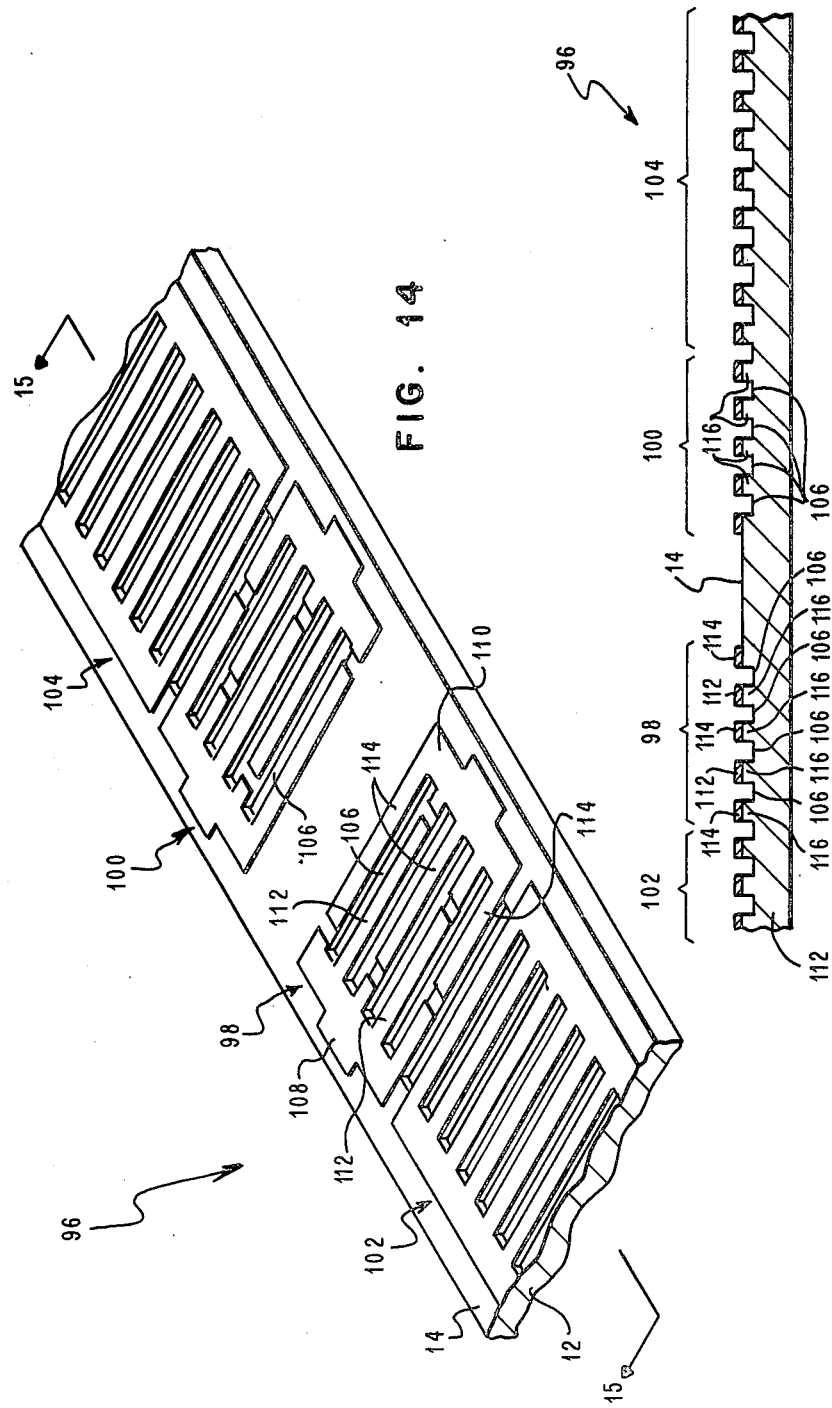

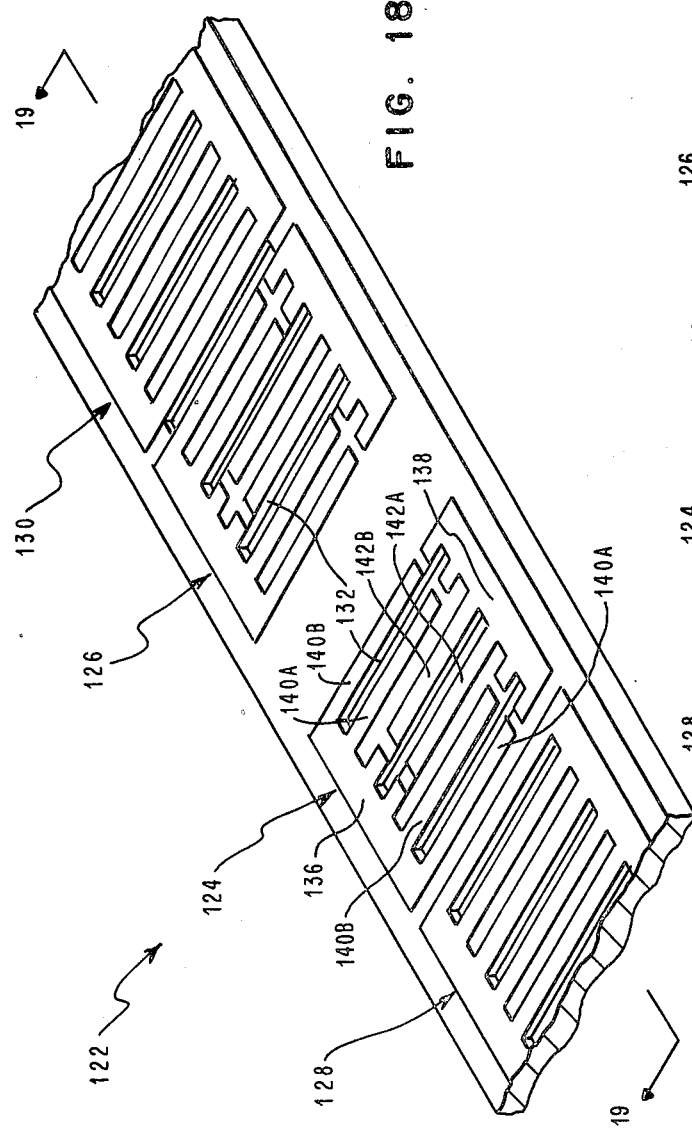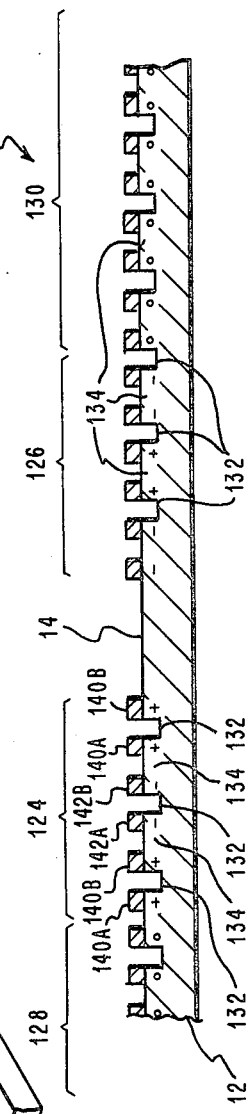

CAVITY 1 RESPONSE

GRATING COUPLER RESPONSE

CAVITY 2 RESPONSE

COMPOSITE RESPONSE

SURFACE ACOUSTIC WAVE DEVICE WITH REFLECTORS

DESCRIPTION

1. Technical Field

The present invention relates generally to acoustic surface wave devices and in one of its aspects to bandpass filters employing such devices.

Surface acoustic wave devices known as SAW devices have many uses in the UHF and VHF frequency ranges. SAW devices have been especially useful as bandpass filters in these frequency ranges.

2. Background Art

U.S. Pat. No. 3,360,749 shows a basic SAW device using interdigital electrode transducers. Such a SAW device has a substrate with at least a surface layer of piezoelectric material and acoustic surface wave transducers disposed on the piezoelectric surface. The transducers convert between an electrical signal and acoustic surface waves propagating on the piezoelectric surface. The transducers can convert between an input electrical signal to output acoustic surface waves or from input acoustic surface waves to an output electrical signal. In the very popular structure shown, there is a one-to-one correspondence between the impulse response of the transducer and its electrode geometry as pointed out in the invited paper of the April, 1973 *IEEE Transactions on Microwave Theory and Techniques* entitled "Impulse Model Design of Acoustic Surface-Wave Filters" by the inventor of the present invention along with D. T. Bell, Jr. and R. C. Rosenfeld, Volume MTT-21, No. 4, pages 162-175. The electrodes are spaced to specify each half cycle in the impulse response. The class of devices realized by this type of transducer is generally referred to as transversal filters, in that the surface acoustic wave makes a single transverse from the input transducer structure to the output transducer structure.

A second major category of SAW devices encompasses resonator devices which were first disclosed by the inventor of the present invention and others in a paper entitled "UHF Surface Acoustic Wave Resonators," 1974 *Ultrasonic Symposium Proceedings, IEEE,* Catalog No. 74 CHO 896-ISU and U.S. Pat. No. 3,886,504. The basic resonator device consists of two arrays of grating reflectors which are placed to form a surface acoustic wave resonant structure. Interdigital SAW transducers are normally placed inside of a cavity region of the resonator to couple energy into and out of the structure. Resonators are frequently referred to as recursive devices, in that the surface wave bounces back and forth many times. Resonators are generally usable for narrowband bandpass filtering and for frequency control application in the VHF and UHF frequency range.

The grating arrays which form the distributed reflective structures for resonators can be metallic or dielectric strips deposited on the surface of the piezoelectric crystal, grooves etched into the surface of the crystal, impurities ion-implanted into the surface, or any other disturbance to the surface which can result in a surface acoustic wave reflection. The transducer electrodes in a normal SAW interdigital transducer can cause reflections. These reflections internal to a SAW transducer have been referred to as "second order" or "higher order" effects in the more traditional interdigital transducer device as pointed out in papers entitled "Second Order Effects in Surface Wave Devices," *IEEE Transactions on Sonics and Ultrasonics,* Volume SU-19, No. 3, July, 1972, by the present inventor and others and "Fundamental—and Harmonic—Frequency Circuit—Model Analysis of Interdigital Transducers with Arbitrary Metallization Ratios and Polarity Sequences," *IEEE Transactions on Microwave Theory and Technique,* Volume MTT-23, No. 11, November, 1975, by W. Richard Smith and William F. Pedler. The internal reflections destroy the one-to-one correspondence between the transducer impulse response and the electrode geometry, and have thus been viewed as detrimental to the transversal-type device. Internal reflection effects in transversal filters have been eliminated by increasing the number of electrodes per acoustic wavelength, resulting in the split-electrode geometry which typically has four electrodes per wavelength as pointed out in "Reflection of a Surface Wave from Three Types of ID Transducers," 1972 *Ultrasonic Symposium Proceedings, IEEE,* No. 72 CHO 708-8SU by de Vries et al. and U.S. Pat. No. 3,727,155 to de Vries. In split electrode transducers, the reflections from one electrode of the transducer are cancelled by reflections from an adjacent transducer electrode. In a three electrode per wavelength geometry shown in U.S. Pat. No. 3,686,518 to the present inventor and William S. Jones, similar cancellation of reflective waves occurs, but only when reflections from three electrodes are considered.

The paper by de Vries et al. mentions, in addition to the original interdigital electrode arrangement and the split electrode arrangement, a split-isolated electrode arrangement in which each electrode finger is split into two as with the split electrode transducer, but only one of the split fingers is connected to the bus bar or "pad".

DISCLOSURE OF INVENTION

In accordance with the present invention, a surface wave device includes a substrate having at least a surface layer of piezoelectric material. An acoustic surface wave transducer is disposed on the piezoelectric surface for converting between an electrical signal and acoustic surface waves propagating on the piezoelectric surface. Reflective structures on the device are responsive to acoustic surface waves, and the means defining the reflective structures causes reflections of acoustic surface waves in the portion of the piezoelectric surface over which the transducer means is disposed.

In the present invention, distributed reflections are deliberately integrated in with an interdigital transducer to realize certain desirable effects, as opposed to the prior art where internal reflections inside transducers were avoided. Whereas both the amplitude and the phase of mechanical reflections internal to the transducer in previous devices were simply by-products of higher order effects in the transducer electrodes' interaction with the surface, the various phase relationships between reflections and transducer generation phase are needed for optimum usage of the present invention. The amplitude and placement of the reflector grating in the present invention is not necessarily coincident with the placement and amplitude of the interdigital transducer driving strength. In other words, the grating reflection and the transducer generation do not necessarily have the same weighting functions in the present invention.

In one arrangement, the transducer means includes opposing pads having alternating electrodes in interdigitated relationship to define an interdigital transducer and the means defining reflective structures includes grooves in the piezoelectric surface between the alternating electrodes. In another arrangement, the interdigital transducer electrodes are in the grooves.

In yet another arrangement of the present invention, the transducer means includes opposing pads having alternating pairs of electrodes in interdigitated relationship to define a split electrode transducer. In one such arrangement, the means defining reflective structures includes grooves in the piezoelectric surface between the electrodes comprising each pair. In yet a different arrangement, the grooves in the piezoelectric surface are between the alternating pairs of electrodes. In still another arrangement, every other alternating electrode is in one of the grooves.

In some arrangements according to the present invention, the means defining reflective structures includes reflector structures superimposed on some of the electrodes. One example includes additional deposited metal superimposed on alternate electrodes in a split electrode transducer.

One surface wave resonator device according to the present invention includes an input transducer means disposed on the piezoelectric surface, an output transducer means disposed on the piezoelectric surface, means defining first and second reflective grating structures on the piezoelectric surface on opposite sides of the combined acoustic surface wave transducer means and means other than transducer means defining reflective structures on the device responsive to acoustic surface waves, causing reflections of acoustic waves in the portion of the piezoelectric surface over which the input transducer means and the output transducer means are disposed.

These and other objects, advantages and features of this invention will be apparent from the following description taken with reference to the accompanying drawings, wherein is shown the preferred embodiments of the invention.

BRIEF DESCRIPTION OF DRAWING

FIG. 10 is a graphical representation of a reflector weighting function by position;

FIG. 11 is a graphical representation of reflector passband responses by frequency for a device according to the present invention having the reflector weighting function by position of FIG. 10;

FIG. 12 is a graphical representation of a transducer weighting function for use in the present invention; and FIG. 13 is a graphical representation of a transducer frequency response for the transducer weighting function of FIG. 12;

FIG. 14 is a prospective view partially cut away of a surface wave resonator device according to the present invention using overlap transducer weighting;

FIG. 15 is a sectional view taken along lines 15—15 of the device of FIG. 14;

FIG. 18 is a perspective view partially cut away of a surface wave resonator device according to the present invention using a split electrode resonator means;

FIG. 19 is a sectional view taken along lines 19—19 of FIG. 18;

BEST MODE FOR CARRYING OUT THE INVENTION

Figure 1:
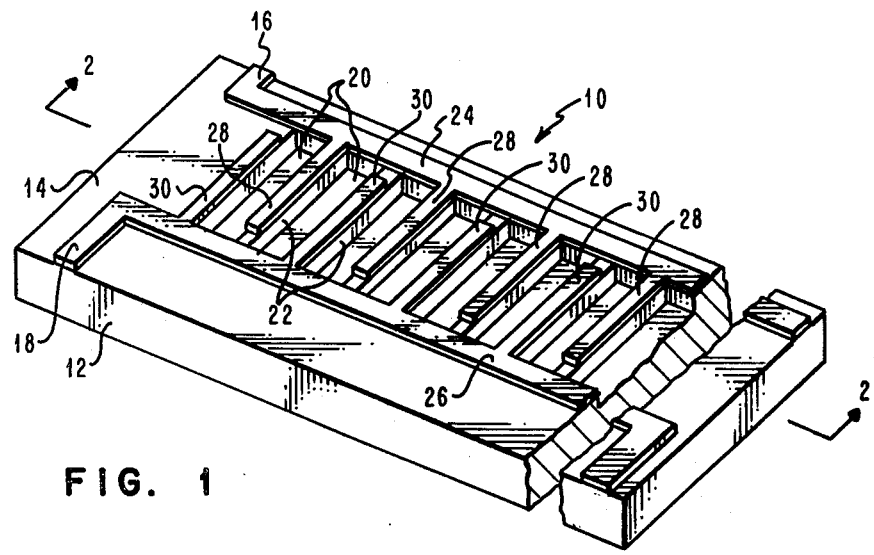
FIG. 1 is a greatly enlarged partially cutaway pictorial view of a portion of a SAW device in accordance with the present invention, not to scale.
Figure 2:
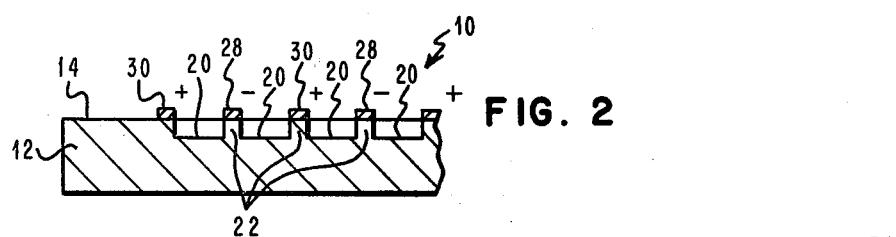
FIG. 2 is a not-to-scale partial view of a section taken along lines 2—2 in FIG. 1.

Referring now to the drawing, and in particular to FIG. 1 and FIG. 2, a surface wave device according to the present invention is referred to generally by reference numeral 10. Surface wave device 10 includes a substrate means 12 having at least a surface layer of piezoelectric material 14, acoustic surface wave transducer means 16 and 18 disposed on piezoelectric surface 14 of substrate means 12 and being operable to convert between an electrical signal and acoustic surface waves propagating on the piezoelectric surface of the substrate means. Surface wave device 10 also includes means 20 other than transducer means 16 and 18 or other transducer means, defining reflective structures 22 on device 10 responsive to acoustic surface waves. Means 20 having reflective structures 22 causes reflections of acoustic surface waves in the portion of piezoelectric surface 14 over which combined transducer means 16 and 18 is disposed.

In the particular embodiment illustrated, acoustic surface wave transducer means 16 and 18 include opposing pads 24 and 26 respectively of electrically conducting material having alternating electrodes 28 and 30 respectively in interdigitated relationship to define an interdigital transducer. Means 20 defining reflective structures 22 includes grooves, also referred to as 20 for convenience, formed in piezoelectric surface 14 between alternating electrodes 28 and 30.

If device 10 is used as a surface wave generator by applying an input electrical signal to input transducer means 16 and 18, the relationship of a forward generated surface wave and a reflection traveling in the same direction, defined as the forward direction, the two waves have a relative phase relationship of −j which is −90°. In the case illustrated the same phase relationship is true for the backward generated wave and the wave reflected in the backward direction.

Figure 3:
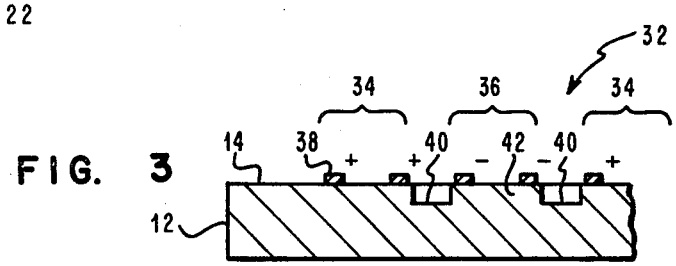
FIG. 3 is a view similar to that of FIG. 2 for a split electrode SAW device in accordance with the present invention with grooves between the pairs of electrodes.

Referring now to FIG. 3, an alternative embodiment of a surface wave device according to the present invention is referred to generally by reference numeral 32. Surface wave device 32 includes acoustic surface waves transducer means which also includes opposing pads similar to electrically conducting pads 24 and 26 out of the previous embodiment, having alternating pairs 34 and 36 of electrodes 38 in interdigitated relationship to define a split electrode transducer. Means 40 defining reflective structures 42 comprises grooves formed in piezoelectric surface 14 between the alternating pairs of electrodes. When device 32 is connected as an acoustic wave generator, it will have the same relative phase relationship between the forward generated surface wave and reflection traveling in the forward direction as does device 10. In the conventional non-split electrode interdigital transducer 10, however, both the electrodes 28 and 30 and grooves 20 contribute reflection effects. In that particular case, they are additive.

Figure 4:
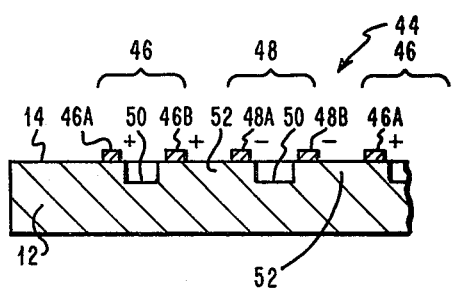
FIG. 4 is a view similar to FIG. 2 of a split electrode SAW device according to the present invention with grooves between the electrodes comprising each pair of electrodes.

Referring to FIG. 4, another embodiment of a surface wave device according to the present invention is referred to generally by reference numeral 44. Device 44 also comprises opposing pads of electrically conducting materials similar to pads 24 and 26 of device 10, but the transducer means of device 44 includes alternating pairs 46 and 48 of electrodes 46a, 46b, 48a and 48b in interdigitated relationship to define a split electrode transducer. Means 50 defining reflective structures forms grooves in piezoelectric surface 14 between the electrodes comprising each pair, which is to say between electrodes 46a and 46b, and also between electrodes 48a and 48b. Device 44 has a phase relationship of +j, which is +90°, between the forward generated wave and the wave reflected in the forward direction, and similarly for the two backward waves.

Figure 5:
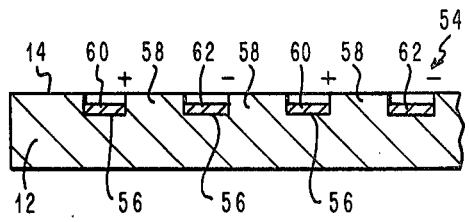
FIG. 5 is a view similar to FIG. 2 of an interdigital SAW device in which the electrodes are in the grooves.

Referring to FIG. 5, yet another alternative embodiment of a surface wave device according to the present invention is referred to generally by reference numeral 54. Means 56 for defining reflective structures 58 forms grooves in piezoelectric surface 14. Acoustic surface wave transducer means similar to transducer means 16 and 18 of device 10 includes opposing pads similar to pads 24 and 26 of device 10 having alternating electrodes 60 and 62 in interdigitated relationship to define an interdigital transducer, but in this case, electrodes 60 and 62 are in the grooves formed by means 56. Device 54 has phase relationship similar to that of device 44. In the case of device 54, however, the reflections due to the non-split electrodes subtract from the reflections due to the grooves formed in surface 14.

Figure 6:
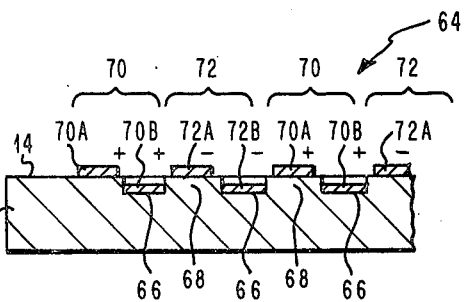
FIG. 6 is a view similar to FIG. 2 of a split electrode SAW device in accordance with the present invention in which one electrode of each electrode pair is in a groove.

Referring to FIG. 6, yet another alternative embodiment of a surface wave device according to the present invention is referred to by reference numeral 64. Surface wave device 64 includes means 66 defining reflective structures 68. Means 66 forms grooves in piezoelectric surface 14. Device 64 includes acoustic surface wave transducer means similar to that of device 10 which includes opposing pads similar to pads 24 and 26 of device 10, having alternating pairs 70 and 72 of electrodes 70a, 70b, 72a and 72b. The acoustic surface wave transducer means thus defines a split electrode transducer. Every other electrode, electrodes 70b and 72b, of the alternating pairs of electrodes is in a groove. Looking at device 64 so that a forward traveling wave is to the right, the right most electrode of each electrode pair is submerged in the reflector groove. The forward reflected wave and the forward electrically generated wave tend to be in phase in this case. The backward reflected wave and the backward generated wave tend to be out of phase. The structure then preferentially radiates to the right.

Figure 7:
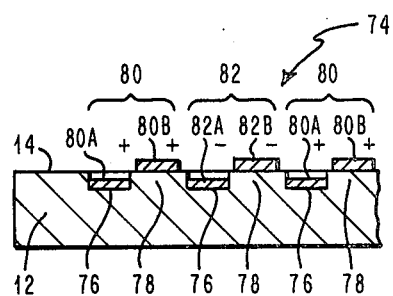
FIG. 7 is a view similar to that of FIG. 6, but with the order of electrodes in the grooves reversed.

Referring to FIG. 7, another embodiment of a device according to the present invention is referred to generally by reference numeral 74. Device 74 includes means 76 defining reflective structures 78, forming grooves in piezoelectric surface 14. Device 74 also has acoustic surface wave transducer means including opposing pads similar to device 10, but having alternating pairs 80 and 82 of electrodes 80a, 80b, 82a and 82b in interdigitated relationship defining a split electrode transducer. Every other electrode, electrodes 80a and 82a, of the alternating pairs of electrodes is in a groove. Device 74 is the complement of device 64 with opposite phase relationships and preferred radiation to the left.

Devices 10, 32, 44, 54, 64 and 74 form two grooves per wavelength for a mid-range frequency, but with differing phases between electrical drive and the acoustic reflection. In practice, it may be desirable to break the one-to-one correspondence and realize independently derived weighting functions for the electrical transduction and for the acoustic reflection. Overlap weighting for transducer electrodes is well known in the art, where the electrical driving strength is varied by varying the amount of overlap between adjacent electrodes. The transducer weighting can also be achieved through means of capacitive weighting which is well known in the art. The reflectivity of grooves, on the other hand, can be varied by varying the depths of the various grooves. Similar effects can be achieved, however, by varying groove width or, in the case of ion-implanted reflectors, the implant dose. Both the electrical transducer drive and the acoustic reflection can be weighted by means of "withdrawal" weighting, in which the transducer or reflector array is selectively thinned by removing either electrodes or reflective structures. Integrating the transduction function with the gratings function causes some interaction between the two, with the primary effect being a distortion of the transduction function by the internal reflections inside the transduction array.

Figure 8:
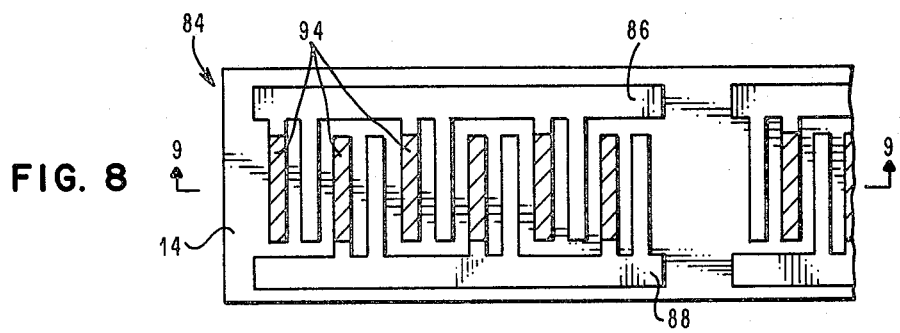
FIG. 8 is a top view of a surface wave resonator device according to the present invention.
Figure 9:
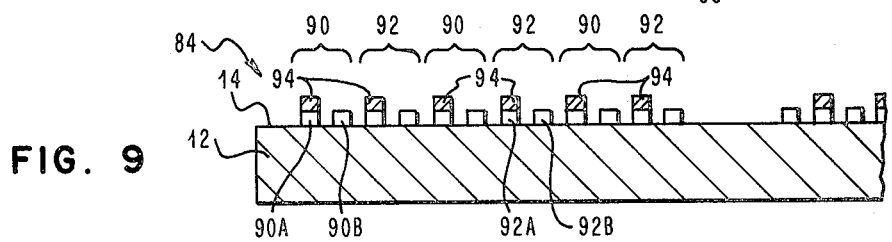
FIG. 9 is a sectional view of the device of FIG. 8 taken along lines 9—9.

Referring now to FIG. 8 and FIG. 9, an alternative embodiment of a device according to the present invention with some characteristics similar to device 64 and device 74 is referred to generally by reference numeral 84. Device 84 includes acoustic surface wave transducer means comprising opposing pads 86 and 88 of electrically conducting material having alternating pairs of electrodes 90 and 92 in interdigitated relationship to define a split electrode transducer. Device 84 also includes means 94 defining reflective structures. Means 94 in this embodiment comprises additional deposited reflective material superimposed on alternate electrodes, electrodes 90a and 92a. The reflective material of means 94 can be a dielectric or even an electrical conductor. In such a case, the electrical conductor which is superimposed on the alternate electrodes does not act as transducer means. As shown, the particular embodiment illustrated has both the electrical transduction and the acoustic reflection effects unweighted. In one arrangement, the two effects would be weighted independently such that the acoustic reflection effect and the electrical transduction reflection effect have a similar pass band. Referring also to FIGS. 10 through 13, a smooth monotonically decreasing weighting function or the weighting function as shown in FIG. 10 for the grating, means defining reflective structures, results in a highly usable flat topped pass band characteristic for the acoustic reflector weighting function. The weighting function with phase-reversed side lobes such as shown in FIG. 12, on the other hand, is necessary to realize a similar band-shape for the transduction frequency response as shown in FIG. 13. A preferred form of the present invention, two dissimilar weighting functions are used in the same transducer function to form a flat passband and unidirectional SAW transducer.

One application of devices according to the present invention to transversal devices is to reduce the tradeoff between insertion loss and triple transit suppression described in a paper entitled "Key Tradeoffs in Saw Transducer Design and Component Specification" by W. Richard Smith in the 1976 *Ultrasonics Symposium Proceedings, IEEE*, Cat. No. CH1120-5SU. Before, the most effective means of doing this has been to use a unidirectional multiphase transducer such as described in U.S. Pat. No. 3,686,518 to the present inventor. In the present invention, for devices such as devices 64, 74 and 84, the transducer preferentially radiates energy in one direction, which by reciprocity can be shown to eliminate acoustic reflections from the same acoustic port. By eliminating acoustic reflections, the triple transit phenomena is eliminated. In the present invention, the triple transit echo from the transducers is cancelled, in that the reflection from a transducer due to its electrical transduction properties is cancelled by the reflection due to the acoustic grating reflectors superimposed upon the transducer.

The transducer structure of the present invention has advantages for use in SAW resonator devices. Spurious longitudinal modes in SAW resonator devices result when the spacing between the two gratings are moved apart by a distance which is large enough, such that the resonance condition is now satisfied at more than one frequency within the bandwidth of the grating reflection coefficient. The need to suppress these modes forces one to use small effective cavity sizes in the normal resonator structure, which in turn forces one to use small coupling transducers, which results in very weak electrical coupling for conventional SAW resonator configurations. The combination of transducing means combined with reflective means of this invention eliminates this onerous trade-off because the coupling transducers are now overlaying the inner portions of the grating reflector itself. This structure allows one to achieve the theoretical maximum effective electrical coupling without introducing extra longitudinal modes. This is one of the major advantages of this structure.

Figure 16:
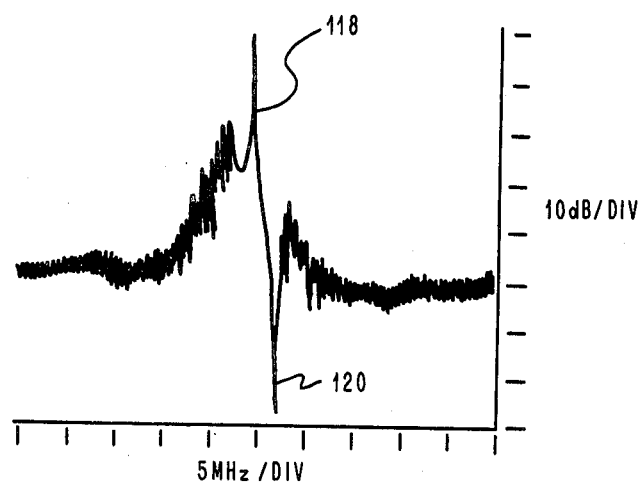
FIG. 16 is a graphical representation of a frequency response of a device according to the present invention.
Figure 17:
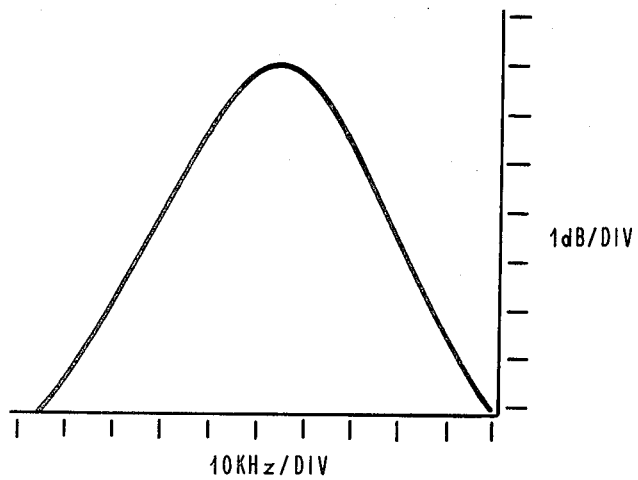
FIG. 17 is an expanded view of peak in the frequency response of FIG. 16.

Referring now to FIG. 14 and FIG. 15, a surface wave resonator device according to the present invention is referred to generally by reference numeral 96. Surface wave resonator device 96 includes substrate means 12 having at least a surface layer 14 of piezoelectric material, acoustic surface wave input transducer means 98 disposed on piezoelectric surface 14 and being operable to convert an input electrical signal to acoustic surface waves propagating on the piezoelectric surface, acoustic surface wave output transducer means 100 disposed on piezoelectric surface 14 and being operable to convert acoustic surface waves propagating on the piezoelectric surface to an output electrical signal, and means defining first and second reflective grating structures 102 and 104 respectively on piezoelectric surface 14 on opposite sides of the combined acoustic surface wave transducer means 98 and 100. Means defining first and second reflective grating structures 102 and 104 is responsive to acoustic surface waves propagating on piezoelectric surface 14. Surface wave resonator device 96 further includes means 106 other than transducer means 98 and 100 defining reflective structures on device 96 responsive to acoustic surface waves. Means 106 causes reflections of acoustic waves in the portion of piezoelectric surface 14 over which input transducer means 98 and output transducer means 100 are disposed. Input transducer means 98 includes opposing pads 108 and 110 of electrically conducting material having alternating electrodes 112 and 114 respectively in interdigitated relationship of varying degrees of overlap to define overlap weighting. Means 106 defines reflective structures 116 by forming grooves in piezoelectric surface 114 between the alternating electrodes 112 and 114 of input transducer means 98. Since the grating reflector arrays of first and second reflective gratings 102 and 104 combined with means 106 allows the spacing between the two arrays to be very small, which eliminates problems of spurious longitudinal modes. The two coupling transducers 98 and 100 can be made to include many active wavelengths, which enhances the coupling strength of the transducers. An experimental frequency response of a resonator device built using this technique is shown in FIGS. 16 and 17. The characteristic highly-peaked resonant response 118 is achieved, but in addition a very deep transmission notch 120 is also obtained on the high frequency side of the device characteristic. This transmission notch is also directly associated with the use of the transducer structure of the present invention in the resonator.

Referring to FIG. 18 and FIG. 19, another embodiment of a surface wave resonator device according to the present invention is referred to generally by reference numeral 122. Surface wave resonator device 122 also includes acoustic surface wave input transducer means 124 disposed on piezoelectric surface 14 and being operable to convert input electrical signal to acoustic surface waves propagating on the piezoelectric surface, acoustic surface wave output transducer means 126 disposed on piezoelectric surface 14 and being operable to convert acoustic surface waves propagating on the piezoelectric surface to an output electrical signal, and means defining first and second reflective grating structures 128 and 130 respectively on piezoelectric surface 14 on opposite sides of the combined acoustic surface wave transducer means 124 and 126 and being responsive to acoustic surface waves propagating on the piezoelectric surface. Device 122 further includes means 132 other than transducer means 124 and 126 defining reflective structures 134. Means 132 defining reflective structures 134 causes reflections of acoustic waves in the portion of piezoelectric surface 14 over which input transducer means 124 and output transducer means 126 are disposed. Input transducer means 124 includes opposing pads 136 and 138 of electrically conducting material having alternating pairs 140 and 142 of electrodes in interdigitated relationship to define a split electrode transducer. Output transducer means 126 is similarly constructed. Means 132 defining reflective structures 134 forms grooves in piezoelectric surface 14 between the electrodes of the pairs of electrodes, which is to say between electrodes 140a and 140b inbetween electrodes 142a and 142b. In either surface wave resonator device 96 or 122 either the input transducer means or the output transducer means can be removed to form a single port resonator device.

Figure 20:
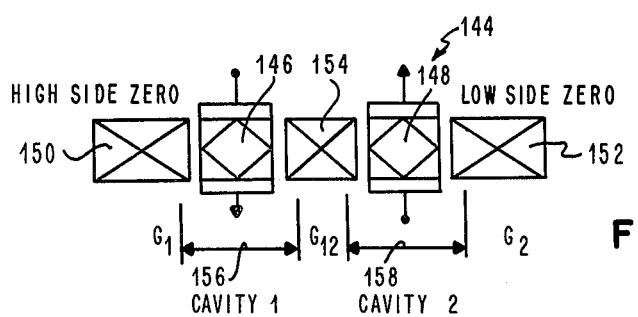
FIG. 20 is a block diagram representation of a two pole bandpass filter according to the present invention.
Figure 21:
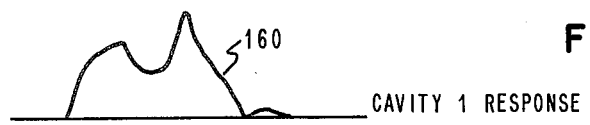
FIG. 21 is a graphical representation of the frequency response of the input transducer means of FIG. 20.
Figure 23:
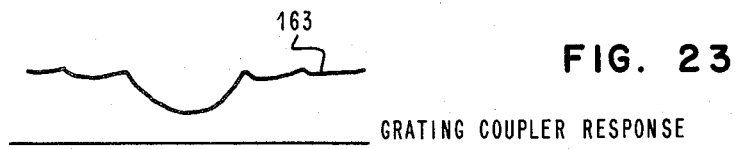
FIG. 23 is a graphical representation of the grating coupler response of the device of FIG. 20.
Figure 22:
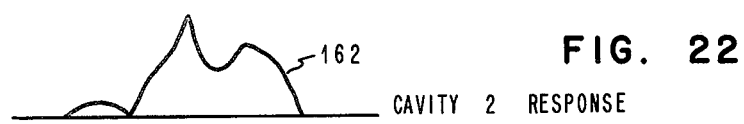
FIG. 22 is a graphical representation of the frequency response of the output transducer means of the filter of FIG. 20.
Figure 24:
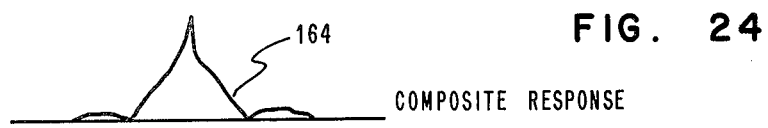
FIG. 24 is a graphical representation of the composite frequency response of the filter of FIG. 20.

Referring now to FIG. 20, two pole filter according to the present invention is referred to generally by reference numeral 144. Filter 144 includes a weighted input transducer means 146 similar to input transducer means 124 of device 122 and a weighted output transducer means 148 similar to output transducer means 126 of device 122. Filter 144 also includes means defining first and second reflective grating structures 150 and 152 respectively similar to structures 128 and 130 of device 122, on opposite sides of the combined acoustic surface wave transducer means 146 and 148 and being responsive to acoustic surface waves propagating on the piezoelectric surface. Filter 144 also includes a similar grating structure 154 disposed on piezoelectric surface between the acoustic surface wave transducer means 146 and 148. Filter 144 also includes means not shown in the schematic representation but similar to means 132 of device 122 for defining reflective structures on filter 144, causing reflections of acoustic waves in the portion of the piezoelectric surface over which input transducer means 146 and output transducer means 148 are disposed. A response area around input transducer means 146, known as a cavity for SAW devices, is referred to by reference numeral 156. Cavity 156 has a frequency response 160 similar to that shown in FIG. 21. Similarly, a cavity 158 around output transducer means 148 has a response 162 similar to that shown in FIG. 22. Grating coupler 154 has a frequency response 163 similar to that shown in FIG. 23 so that the combined response of filter 144 is the highly peaked two pole frequency response 164 of FIG. 24.

Figure 25:
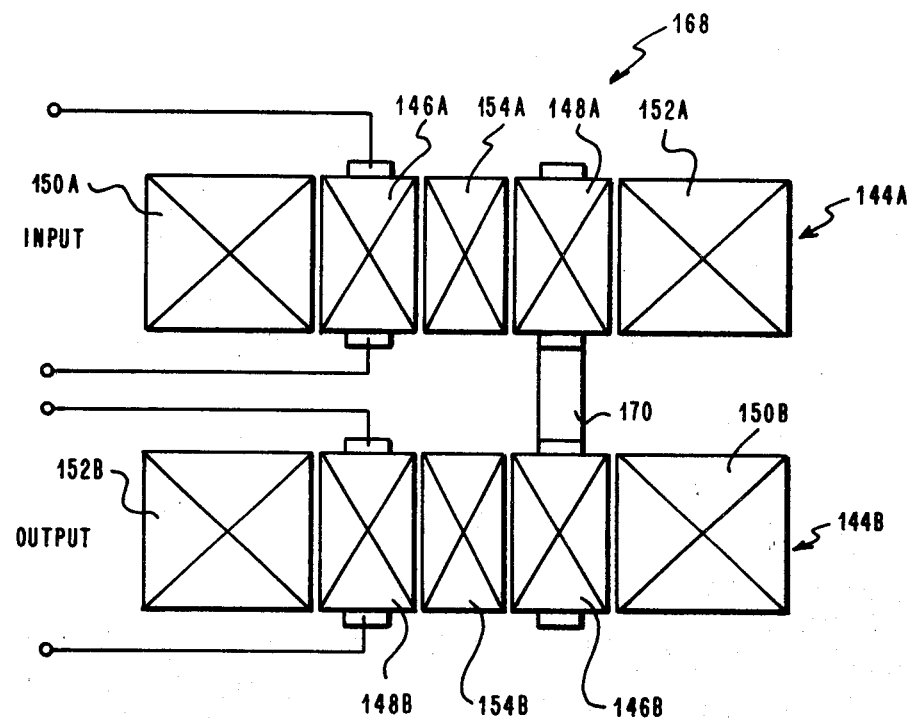
FIG. 25 is a block diagram representation of a four pole bandpass filter according to the present invention.

Referring now to FIG. 25, a four pole filter according to the present invention is referred to generally by reference numeral 168. Four pole filter 168 includes two structures similar to device 144, 144a and 144b, wherein similar elements are given similar numbers to the corresponding elements in FIG. 20. Input transducer means 146a is thus the input of four pole filter 168, and output transducer means 148b is the output of four pole filter 168. Output transducer means 148a is electrically coupled to input transducer means 146b, but this coupling could also be made acoustically.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

I claim:

1. A surface wave device comprising in combination:
substrate means having at least a surface layer of piezoelectric material;
acoustic surface wave transducer means disposed on the piezoelectric surface of the substrate means and being operable to convert between an electrical signal and acoustic surface waves propagating on the piezoelectric surface of the substrate means; and
means other than transducer means defining reflective structures on the device responsive to acoustic surface waves wherein the means defining reflective structures causes reflections of acoustic surface waves in the portion of the piezoelectric surface over which the transducer means is disposed, and
wherein the acoustic surface wave transducer means comprises opposing pads have alternating groups of electrodes in interdigitated relationship to define a split electrode transducer and the means defining reflective structures forms grooves in the piezoelectric surface between at least one pair of the electrodes comprising a group.

2. A surface wave device according to claim 1, wherein each group of electrodes consists of a pair of electrodes, and the means defining reflective structures forms grooves in the piezoelectric surface between the electrodes comprising each pair.

3. A surface wave device comprising in combination:
substrate means having at least a surface layer of piezoelectric material;
acoustic surface wave transducer means disposed on the piezoelectric surface of the substrate means and being operable to convert between an electrical signal and acoustic surface waves propagating on the piezoelectric surface of the substrate means; and
means other than transducer means defining reflective structures on the device responsive to acoustic surface waves wherein the means defining reflective structures causes reflections of acoustic surface waves in the portion of the piezoelectric surface over which the transducer means is disposed, and
wherein the means defining reflective structures forms grooves in the piezoelectric surface and the acoustic surface wave transducer means comprises opposing pads having alternating groups of electrodes in interdigitated relationship defining a split electrode transducer wherein at least one but not every electrode of a group of electrodes is in a groove.

4. A surface wave device according to claim 3 wherein each group of electrodes consists of a pair of electrodes and every other electrode of the alternating pairs of electrodes is in a groove.

5. A surface wave device comprising in combination:
substrate means having at least a surface layer of piezoelectric material;
acoustic surface wave transducer means disposed on the piezoelectric surface of the substrate means and being operable to convert between an electrical signal and acoustic surface waves propagating on the piezoelectric surface of the substrate means; and
means other than transducer means defining reflective structures on the device responsive to acoustic surface waves wherein the means defining reflective sturctures causes reflections of acoustic surface waves in the portion of the piezoelectric surface over which the transducer means is disposed, and wherein the acoustic surface wave transducer means comprises opposing pads having electrodes and the means defining reflective structures comprises reflector structures superimposed on at least some of the electrodes.

6. A surface wave device comprising in combination:
   substrate meas having at least a surface layer of piezoelectric material;
   acoustic surface wave transducer means disposed on the piezoelectric surface of the substrate means and being operable to convert between an electrical signal and acoustic surface waves propagating on the piezoelectric surface of the substrate means; and
   means other than transducer means defining reflective structures on the device responsive to acoustic surface waves wherein the means defining reflective structures causes reflections of acoustic surface waves in the portion of the piezoelectric surface over which the transducer means is disposed, and
   wherein the acoustic surface wave transducer means comprises opposing pads having alternating groups of electrodes in interdigitated relationship to define a split electrode transducer and the means defining reflective structures comprises additional deposited reflective material superimposed on at least one but not every electrode of a group.

7. A surface wave device according to claim 6 wherein each group of electrodes consists of a pair of electrodes and the means defining reflective structures comprises additional deposited reflective material superimposed on alternate electrodes.

8. A surface wave resonator device comprising in combination:
   substrate means having at least a surface layer of piezoelectric material;
   acoustic surface wave input transducer means disposed on the piezoelectric surface of the substrate means and being operable to convert an input electrical signal to acoustic surface waves propagating on the piezoelectric surface of the substrate means;
   acoustic surface wave output transducer means disposed on the piezoelectric surface of the substrate means and being operable to convert acoustic surface waves propagating on the piezoelectric surface of the substrate means to an output electrical signal;
   means defining first and second reflective grating structures on the piezoelectric surface of the substrate means on opposite sides of the combined acoustic surface wave transducer means and being responsive to acoustic surface waves propagating on the piezoelectric surface of the substrate means; and
   means other than the transducer means defining reflective structures on the device responsive to acoustic surface waves wherein the means defining reflective structures causes reflections of acoustic surface waves in the portion of the piezoelectric surface over which the input transducer means and the output transducer means are disposed, and
   wherein the acoustic surface wave input transducer means comprises opposing pads having alternating pairs of electrodes in interdigitated relationship to define a split electrode transducer and the means defining reflective structures forms grooves in the piezoelectric surface between the electrodes of the pairs of electrodes.

9. A surface wave resonator device according to claim 8 further comprising means defining first a reflective grating coupler on the piezoelectric surface of the substrate means between the input transducer means and the output transducer means and being responsive to acoustic surface waves propagating on the piezoelectric surface of the substrate means, wherein the surface wave resonator device forms a two pole filter.

10. A surface wave resonator device according to claim 9 further comprising means for electrically coupling output transducer means to a similar surface wave resonator device for forming a four pole filter.

11. A surface wave device comprising in combination:
    substrate means having at least a surface layer of piezoelectric material;
    acoustic surface wave transducer means disposed on the piezoelectric surface of the substrate means and being operable to convert between an electrical signal and acoustic surface waves propagating on the piezoelectric surface of the substrate means, wherein the acoustic surface wave transducer means has a predetermined weighting function; and
    means defining reflective structures on the device responsive to acoustic surface waves wherein the means defining reflective structures causes reflections of acoustic surface waves in the portion of the piezoelectric surface over which the transducer means is disposed and as a predetermined weighting function other than the predetermined weighting function of the acoustic surface wave transducer means, and
    wherein the means defining reflective structures forms grooves in the piezoelectric surface and variations in the length of the grooves achieves the predetermined weighting function for the means defining reflective structures.

12. A surface wave device comprising in combination:
    substrate means having at least a surface layer of piezoelectric material;
    acoustic surface wave transducer means disposed on the piezoelectric surface of the substrate means and being operable to convert between an electrical signal and acoustic surface waves propagating on the piezoelectric surface of the substrate means, wherein the acoustic surface wave transducer means has a predetermined weighting function; and
    means defining reflective structures on the device responsive to acoustic surface waves wherein the means defining reflective structures causes reflections of acoustic surface waves in the portion of the piezoelectric surface over which the transducer means is disposed and as a predetermined weighting function other than the predetermined weighting function of the acoustic surface wave transducer means, and
    wherein the means defining the reflective structures defines reflective structures with the centers of reflection spaced apart integral multiples of approximately one half wavelength of the operative acoustic wave frequency and variations in the spacing between reflective structures achieves the predetermined weighting function for the means defining reflective structures.

13. A surface wave resonator device comprising in combination:
- substrate means having at least a surface layer of piezoelectric material;
- acoustic surface wave input transducer means disposed on the piezoelectric surface of the substrate means and being operable to convert an input electrical signal to acoustic surface waves propagating on the piezoelectric surface of the substrate means;
- acoustic surface wave output transducer means disposed on the piezoelectric surface of the substrate means and being operable to convert acoustic surface waves propagating on the piezoelectric surface of the substrate means to an output electrical signal;
- means defining first and second reflective grating structures on the piezoelectric surface of the substrate means on opposite sides of the combined acoustic surface wave transducer means and being responsive to acoustic surface waves propagating on the piezoelectric surface of the substrate means; and
- means other than the transducer means defining reflective structures on the device responsive to acoustic surface waves wherein the means defining reflective structures causes reflections of acoustic waves in the portion of the piezoelectric surface over which the input transducer means and the output transducer means are disposed, and
- wherein at least one of the acoustic surface wave transducer means comprises opposing pads having alternating groups of electrodes in interdigitated relationship to define a split electrode transducer and the means defining reflective structures forms at least one groove in the piezoelectric surface between at least one pair the electrodes comprising a group.

14. A surface wave device according to claim 13 wherein each group of electrodes consists of a pair of electrodes, and the means defining reflective structures forms grooves in the piezoelectric surface between the electrodes comprising each pair.

15. A surface wave resonator device comprising in combination:
- substrate means having at least a surface layer of piezoelectric material;
- acoustic surface wave input transducer means disposed on the piezoelectric surface of the substrate means and being operable to convert an input electrical signal to acoustic surface waves propagating on the piezoelectric surface of the substrate means;
- acoustic surface wave output transducer means disposed on the piezoelectric surface of the substrate means and being operable to convert acoustic surface wave propagating on the piezoelectric surface of the substrate means to an output electrical signal;
- means defining first and second reflective grating structures on the piezoelectric surface of the substrate means on opposite sides of the combined acoustic surface wave transducer means and being responsive to acoustic surface waves propagating on the piezoelectric surface of the substrate means; and
- means other than the transducer means defining reflective structures on the device responsive to acoustic surface waves wherein the means defining reflective structures causes reflections of acoustic waves in the portion of the piezoelectric surface over which the input transducer means and the output transducer means are disposed, and
- wherein the means defining reflective structures forms grooves in the piezoelectric surface and at least one of the acoustic surface wave transducer means comprises opposing pads having alternating groups of electrodes in interdigitated relationship defining a split electrode transducer wherein at least one but not every electrode of a group of electrodes is in a groove.

16. A surface wave device according to claim 15 wherein each group of electrodes consists of a pair of electrodes and every other electrode of the alternating pairs of electrodes is in a groove.

17. A surface wave resonator device comprising in combination:
- substrate means having at least a surface layer of piezoelectric material;
- acoustic surface wave input transducer means disposed on the piezoelectric surface of the substrate means and being operable to convert an input electrical signal to acoustic surface waves propagating on the piezoelectric surface of the substrate means;
- acoustic surface wave output transducer means disposed on the piezoelectric surface of the substrate means and being operable to convert acoustic surface waves propagating on the piezoelectric surface of the substrate means to an output electrical signal;
- means defining first and second reflective grating structures on the piezoelectric surface of the substrate means on opposite sides of the combined acoustic surface wave transducer means and being responsive to acoustic surface waves propagating on the piezoelectric surface of the substrate means; and
- means other than the transducer means defining reflective structures on the device responsive to acoustic surface waves wherein the means defining reflective structures causes reflections of acoustic waves in the portion of the piezoelectric surface over which the input transducer means and the output transducer means are disposed, and
- wherein at least one of the acoustic surface wave transducer means comprises opposing pads having electrodes and the means defining reflective structures comprises reflector structures superimposed on at least some of the electrodes.

18. A surface wave resonator device comprising in combination:
- substrate means having at least a surface layer of piezoelectric material;
- acoustic surface wave input transducer means disposed on the piezoelectric surface of the substrate means and being operable to convert an input electrical signal to acoustic surface waves propagating on the piezoelectric surface of the substrate means;
- acoustic surface wave output transducer means disposed on the piezoelectric surface of the substrate means and being operable to convert acoustic surface waves propagating on the piezoelectric surface of the substrate means to an output electrical signal;
- means defining first and second reflective grating structures on the piezoelectric surface of the substrate means on opposite sides of the combined acoustic surface wave transducer means and being responsive to acoustic surface waves propagating on the piezoelectric surface of the substrate means; and means other than the transducer means defining reflective structures on the device responsive to acoustic surface waves wherein the means defining reflective structures causes reflections of acoustic waves in the portion of the piezoelectric surface over which the input transducer means and output transducer means are disposed, and wherein at least one of the acoustic surface wave transducer means comprises opposing pads having alternating groups of electrodes in interdigitated relationship to define a split electrode transducer and the means defining reflective structures comprises additional deposited reflective material superimposed on at least one but not every electrode of a group.

19. A surface wave device according to claim 18 wherein each group of electrodes consists of a pair of electrodes and the means defining reflective structures comprises additional deposited reflective material superimposed on alternate electrodes.

* * * * *